US011823970B2

United States Patent
Rieder et al.

(10) Patent No.: US 11,823,970 B2
(45) Date of Patent: Nov. 21, 2023

(54) RADAR PACKAGE WITH OPTICAL LENS FOR RADAR WAVES

(71) Applicant: Infineon Technologies AG, Neubiberg (DE)

(72) Inventors: Bernhard Rieder, Regensburg (DE); Thomas Kilger, Regenstauf (DE)

(73) Assignee: Infineon Technologies AG, Neubiberg (DE)

(*) Notice: Subject to any disclaimer, the term of this patent is extended or adjusted under 35 U.S.C. 154(b) by 47 days.

(21) Appl. No.: 17/308,472

(22) Filed: May 5, 2021

(65) Prior Publication Data
US 2022/0359328 A1 Nov. 10, 2022

(51) Int. Cl.
| H01L 23/31 | (2006.01) |
| H01L 21/56 | (2006.01) |
| H01Q 1/22 | (2006.01) |
| H01Q 19/06 | (2006.01) |
| H01L 23/00 | (2006.01) |

(52) U.S. Cl.
CPC .......... *H01L 23/3135* (2013.01); *H01L 21/56* (2013.01); *H01Q 1/2283* (2013.01); *H01Q 19/06* (2013.01); *H01L 24/02* (2013.01); *H01L 24/13* (2013.01); *H01L 24/16* (2013.01); *H01L 2224/02379* (2013.01); *H01L 2224/13024* (2013.01); *H01L 2224/16225* (2013.01); *H01L 2924/10158* (2013.01)

(58) Field of Classification Search
None
See application file for complete search history.

(56) References Cited

U.S. PATENT DOCUMENTS

| 7,576,687 B2 | 8/2009 | Forstner |
| 2006/0176583 A1 | 8/2006 | Jin et al. |
| 2007/0026567 A1 | 2/2007 | Beer et al. |
| 2009/0267249 A1 | 10/2009 | Su et al. |
| 2010/0051982 A1 | 3/2010 | Lin et al. |

(Continued)

FOREIGN PATENT DOCUMENTS

| DE | 102007046471 A1 | 5/2008 |
| DE | 102016107678 A1 | 10/2017 |

(Continued)

OTHER PUBLICATIONS

"PTFE Plano-Convex Lenses." THORLABS, Thorlabs, Inc., 1999-2021, Retrieved on Apr. 14, 2021 [Online] URL: https://www.thorlabs.com/newgrouppage9.cfm?objectgroup_ID=1627.

(Continued)

*Primary Examiner* — Long Pham
(74) *Attorney, Agent, or Firm* — Harrity & Harrity, LLP

(57) ABSTRACT

A radar chip package includes a radar monolithic microwave integrated circuit (MMIC) having a backside, a frontside arranged opposite to the backside, and lateral sides that extend between the backside and the frontside, wherein the radar MIMIC comprises a recess that extends from the backside at least partially towards the frontside; a plurality of electrical interfaces coupled to the frontside of the radar MIMIC; at least one antenna arranged at the frontside of the radar MIMIC; and a lens formed over the recess and the at least one antenna, wherein the lens is coupled to the backside of the radar MMIC.

26 Claims, 6 Drawing Sheets

(56) References Cited

U.S. PATENT DOCUMENTS

2016/0293557 A1 10/2016 Topak et al.
2019/0221531 A1 7/2019 Meyer et al.

FOREIGN PATENT DOCUMENTS

DE 102016114482 A1 2/2018
JP 2015188174 * 10/2015

OTHER PUBLICATIONS

J. Grzyb, K. Statnikov and U. R. Pfeiffer, "A 2×2 lens-integrated on-chip antenna system for a 820 GHz multiplier-chain source in SiGe technology," 2014 IEEE Antennas and Propagation Society International Symposium (APSURSI), pp. 737-738, doi: 10.1109/APS.2014.6904698.
A. K. M. Z. Hossain, M. I. Ibrahimy and S. M. A. Motakabber, "Integrated Si Lens Antenna with Planar Log Spiral Feed for THz Band," 2014 International Conference on Computer and Communication Engineering, 2014, pp. 284-287, doi: 10.1109/ICCCE.2014.87.

* cited by examiner

RADAR PACKAGE WITH OPTICAL LENS FOR RADAR WAVES

BACKGROUND

A radar system may include one or more radar chips, one of which transmits radar waves into an environment and the same radar chip and/or a different radar chip receives reflected radar waves that are reflected by one or more objects in the environment. A detection range of the radar system is the distance to an object that can receive a transmitted radar wave from the radar system and reflect the radar wave via backscattering back to the radar system. Radar antenna size is related to its detection range, with larger antennas being able to transmit/detect radar waves over a longer detection range. Because the antenna size for radar chips is quite small, with a total area in the $mm^2$ range, the detection range is also short. However, it is not desirable to increase the size of radar antennas, as it would lead to increase in chip size and costs.

Therefore, an improved device that increases a detection range without increasing the radar antenna size may be desirable.

SUMMARY

One or more embodiments provide a radar chip package that includes: a radar monolithic microwave integrated circuit (MIMIC) having a backside, a frontside arranged opposite to the backside, and lateral sides that extend between the backside and the frontside, wherein the radar MMIC includes a recess that extends from the backside at least partially towards the frontside; a plurality of electrical interfaces coupled to the frontside of the radar MIMIC; at least one antenna arranged at the frontside of the radar MIMIC; and a lens formed over the recess and the at least one antenna, wherein the lens is coupled to the backside of the radar MIMIC.

One or more embodiments provide a method of manufacturing a radar chip package that includes a radar MMIC having a backside, a frontside arranged opposite to the backside, and lateral sides that extend between the backside and the frontside. The method of manufacturing includes: etching the backside of a radar MIMIC to form a recess that extends from the backside at least partially towards the frontside of the radar MIMIC; coupling a plurality of electrical interfaces to the frontside of the radar MIMIC; and forming a lens over the recess and at least one antenna, wherein the lens is coupled to the backside of the radar MIMIC.

One or more embodiments provide a radar chip package assembly that includes: a radar MMIC having a backside, a frontside arranged opposite to the backside, and lateral sides that extend between the backside and the frontside; at least one antenna arranged at the frontside of the radar MIMIC; a plurality of electrical interfaces arranged at the frontside of the radar MMIC, wherein the plurality of electrical interfaces are arranged around a first opening formed therebetween; a dielectric layer coupled to the frontside of the radar MMIC between the radar MMIC and the plurality of electrical interfaces, wherein the dielectric layer includes a conductive redistribution layer that is electrically coupled to and between the radar MIMIC and the plurality of electrical interfaces; and a lens coupled to the dielectric layer and is arranged in the first opening formed between the plurality of electrical interfaces.

BRIEF DESCRIPTION OF THE DRAWINGS

Embodiments are described herein making reference to the appended drawings.

DETAILED DESCRIPTION

Figure 1A:
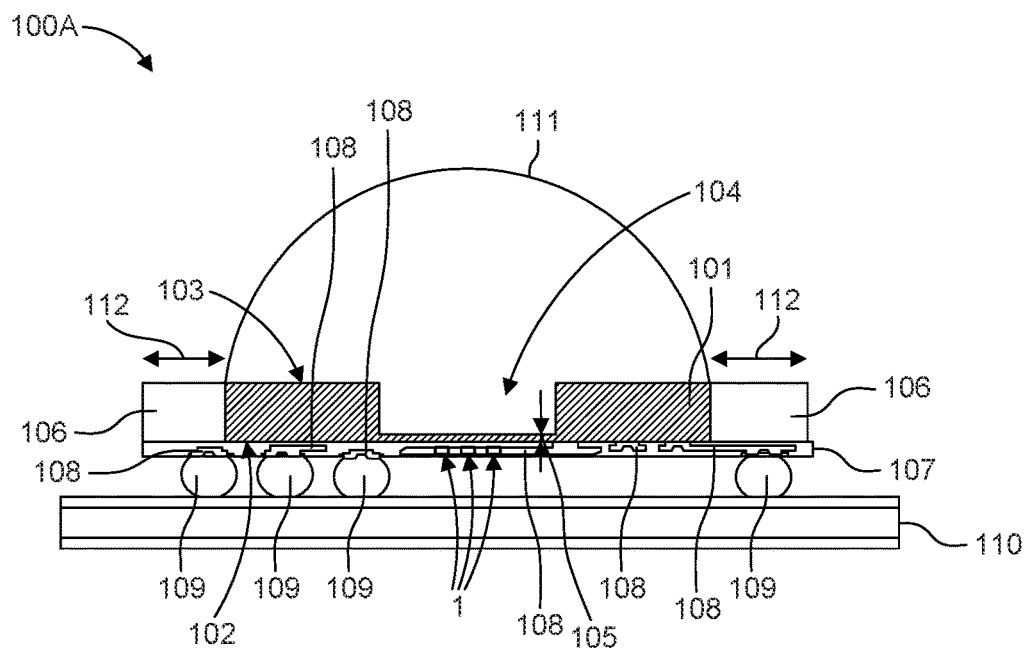
FIG. 1A shows a cross-sectional diagram of a radar chip package according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation. For example, lateral, vertical, and overlapping spatial or positional relationships may be described in reference to another element or feature, without being limited to a specific orientation of the device as a whole.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The terms "substantially" and "approximately" may be used herein to account for small manufacturing tolerances (e.g., within 5%) that are deemed acceptable in the industry without departing from the aspects of the embodiments described herein. For example, a resistor with an approximate resistance value may practically have a resistance within 5% of that approximate resistance value.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

One or more embodiments relate to a radar chip package that houses a radar monolithic microwave integrated circuit (MIMIC). The radar chip package comprises a transmitter antenna array, a receiver antenna array, or both that are either integrated with or electrically connected to the MMIC. The radar chip package includes a domed (e.g., hemispherical, elliptical, etc.) lens to significantly reduce the antenna size which can allow radar detection ranges up to mid-range radar. The domed lens is configured to collimate the radiated (i.e., transmitted) and/or received energy of radar waves, which increases the transmission or detection range of the antenna. While not limited to, a preferred frequency for the radar waves may start at 300 GHz and above. Otherwise, the size of the lens becomes too bulky for the size of the chip and/or package.

Figure 1B:
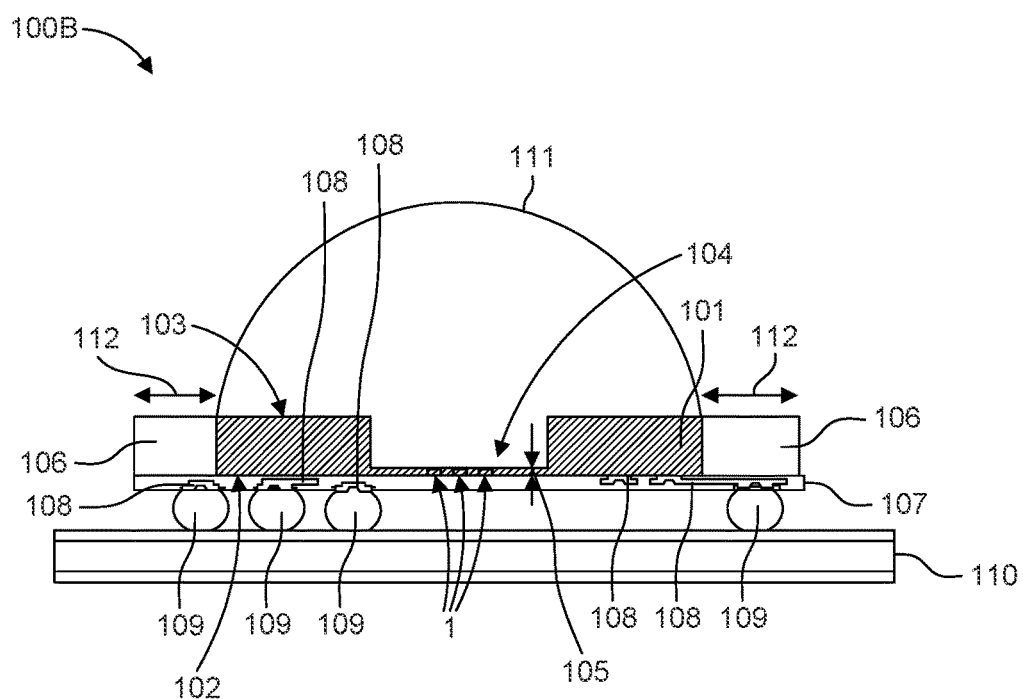
FIG. 1B shows a cross-sectional diagram of another radar chip package according to one or more embodiments.

FIG. 1A shows a cross-sectional diagram of a radar chip package 100A according to one or more embodiments. FIG. 1B shows a cross-sectional diagram of a radar chip package 100B according to one or more embodiments. Radar chip packages 100A and 110B are the same with the exception of the placement of radar antenna. In radar chip package 100A, one or more radar antenna 1 are integrated in a redistribution layer (RDL) disposed on the frontside of a radar MMIC 101. In radar chip package 100A, one or more radar antenna 1 are integrated in the radar MMIC 101 itself. For example, one or more radar antenna 1 can be provided in a first metallization layer of the radar MMIC 101 that is arranged at or most proximate to the frontside surface of the MMIC 101. While the MMIC 101 may have many metallization layers, there are no other metallization layers between the first metallization layer and the frontside 102. The one or more radar antenna 1 may include transmission (TX) antenna, reception (RX) antenna, or a combination thereof.

In this example, the radar chip packages 100A and 100B are embedded wafer level ball grid array (eWLB) packages.

The radar chip packages 100A and 100B include the radar MIMIC 101 that includes a semiconductor substrate. The semiconductor substrate may be made out of silicon and is originally part of a wafer used during front-end production of many MMICs. The front-end production may start with a clean disc-shaped silicon wafer that will ultimately become many silicon chips. First, a photomask that defines the circuit patterns for circuit elements (e.g., transistors) and interconnect layers may be created. This mask may then be laid on the clean silicon wafer and is used to map the circuit design. Transistors and other circuit elements may then be formed on the wafer through photolithography. Photolithography involves a series of steps in which a photosensitive material is deposited on the wafer and exposed to light through a patterned mask; unwanted exposed material is then etched away, leaving only the desired circuit pattern on the wafer. By stacking the various patterns, individual elements of the semiconductor chip may be defined.

The radar MMIC 101 includes a frontside 102 and a backside 103. Lateral sides of the radar MMIC 101 extend between the backside 103 and the frontside 102. A recess 104 is formed in the semiconductor substrate at the backside 103 of the radar MMIC 101. The recess 104 extends from the backside 103 at least partially towards the frontside 102 and, in some embodiments, may extend fully through the substrate (i.e., through the MMIC 101) to the frontside 102. The recess 104 is laterally centered on a geometric center of the backside 103. The at least one antenna 1 is positioned such that it is in an area that vertically overlaps with the recess 104.

In the case that the recess 104 extends from the backside 103 at least partially towards the frontside 102, a remaining portion 105 of the substrate adjacent to the recess 104 is left. This remaining portion 105 should be thick enough to avoid silicon cracks, with a minimum thickness of at least 10 µm and with a preferred minimum thickness of at least 30 µm. In the case that the recess 104 extends fully through the substrate, silicon cracks are no longer a concern.

The radar chip packages 100A and 100B include mold compound 106 in a fan-out area 112 of the radar chip packages (i.e., around the lateral perimeter/sides of the MMIC 101).

The radar chip packages 100A and 100B include a dielectric layer 107 coupled to the frontside 102 of the MMIC 101 and to the frontside of the mold compound 106. That is, the dielectric layer 107 extends laterally across from one perimeter (edge) of the radar chip package to an opposite perimeter (edge) of the radar chip package. The dielectric layer 107 includes electrical conductive paths 108 (e.g., copper) routed therethrough that electrically couple the MMIC 101 to respective electrical interfaces 109 bonded to the dielectric layer 107 (e.g., soldered to the electrical conductive paths 108 of the dielectric layer 107). In particular, the electrical conductive paths 108 are electrically connected to, for example, the first metallization later of the radar MMIC 101 that is arranged at or most proximate to the frontside surface of the MMIC 101.

The electrically conductive paths 108 may be part of a redistribution layer (RDL) that provide electrical connections to the electrical interfaces 109. The electrical interfaces 109 are coupled to the dielectric layer 107 on the side opposite to the MMIC 101. The electrical interfaces 109 may be either solder balls, solder pads, or some other electrical interface configured to be bonded (e.g., soldered) to a circuit substrate 110, such as a circuit board (e.g., a printed circuit board (PCB)) or some other dielectric substrate with conductive interconnects routed therethrough. The electrically conductive paths 108 of the RDL and the electrical interfaces 109 carry electrical signals between the integrated circuit on the MMIC 101 and an external device (via the circuit substrate 110).

The radar chip packages 100A and 100B further include a lens 111 arranged at the backside 103 of the MMIC 101 and integrated within the recess 104. In other words, the lens 111 fills the recess 104 and laterally extends from the recess 104 over the backside 103 of the MMIC 101. Thus, the lens 104 covers at least a portion of the backside 103, including the recess 104 and lateral portions of the backside that extend from the opening of the recess 104 towards the outer perimeter of the MIMIC 101. The lens 111 is centered over the recess 104. Thus, like the recess 104, the lens is laterally centered on a geometric center of the backside 103 (i.e., of the MMIC 101). The recess 104 and the lens 111 being centered on the MMIC 101 provides uniformity in received and/or transmitted radiation (i.e., produces a symmetric radiation pattern) and may provide the greatest degree of magnification of the radar waves. The lens 111 improves the antenna gain and power in order to increase the detection range of the antenna.

Exact centering of the elements mentioned above is not necessarily required and may be "substantially" centered to account for production and manufacturing tolerances, as well as layout needs in the design of the package. Thus, lens 111 can be centered or substantially centered with respect to the antenna(s) 1. The recess 104 can also be centered or substantially centered over the antenna(s) 1. In effect, the lens 111 need not be centered precisely over the recess 104 but typically may be substantially centered over the recess 104. In some cases, due to layout needs in the design of the package, the recess 104 can be offset from the geometrical center of the antenna or antenna array. As a result, the lens 111 is also offset from the geometrical center of the antenna or antenna array. Shifting the lens 111 from the centering above the antenna(s) can result in an asymmetric radiation pattern that can be preferable for certain applications.

The lens 111 is configured to magnify radar waves as they are transmitted by the at least one antenna 1 and/or magnify radar waves received from an environment external to the radar MIMIC, for example, transmitted radar waves that are reflected back to the radar MIMIC by backscattering. The reflected radar waves may be transmitted by the radar MIMIC 101 or by another radar source such as another radar MMIC.

The lens 111 is a one-piece integral structure that has a dome-shape (e.g., hemispherical, elliptical, etc.) to significantly reduce the antenna size which can allow radar detection ranges up to mid-range radar. The shape of the lens 111 also conforms to shape of the backside 103 that includes either the open recess 104, as is the case in FIG. 1A, or the filled recess 104 that is filled with mold compound 106, as is the case in FIG. 5. By placing the lens 111 on the backside 103 over the recess 104, the lens 111 is configured to collimate the radiated (i.e., transmitted) and/or received energy of radar waves, which increases the transmission or detection range of the antenna.

The diameter of the lens is about 10 times the (center) wavelength of the radiated and/or received radar waves. The lens is made from polytetrafluoroethylene (PTFE), silicon, polymethylpentene (PMP or TPX), ZEONEX®, polyethylene, silicone, epoxy, imide, thermoplastic polymer, a duroplastic polymer, a polymer mixture, a thermosetting material, or a laminate material, but is not limited thereto.

FIGS. 2A-2F illustrate cross-sections of a processing flow of a method of manufacturing the radar chip package 100B according to one or more embodiments.

Figure 2A:
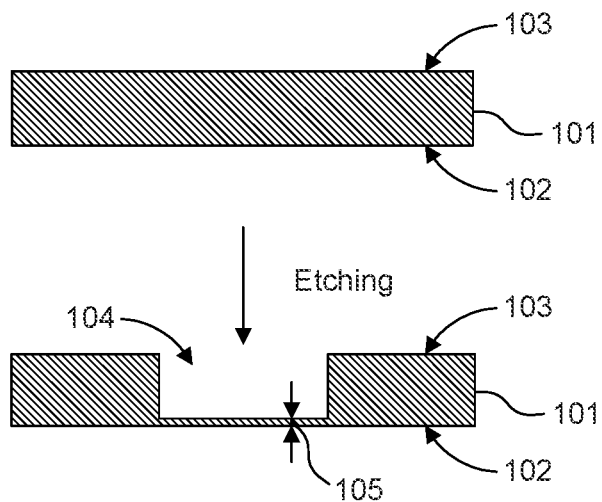
FIGS. 2A-2F illustrate cross-sections of a processing flow of a method of manufacturing the radar chip package of FIG. 1B according to one or more embodiments.

In FIG. 2A, a semiconductor wafer comprising the MMIC 101 is etched from the backside 103 to form recess 104 and remaining portion 105.

Figure 2B:
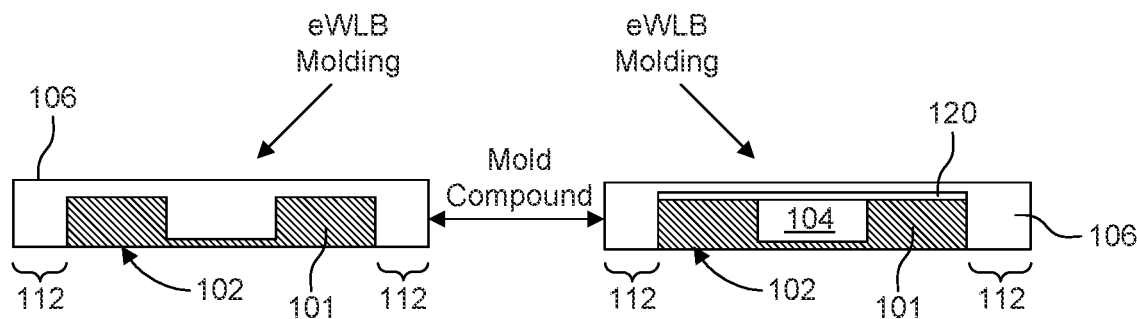

In FIG. 2B, mold compound 106 is applied to cover the backside 103 and the lateral sides of the MMIC in the fan-out areas 112. In addition, FIG. 2B illustrates two options for applying the mold compound 106. On the left, the mold compound 106 fills the recess 104. On the right, a lid 120 is arranged on the backside 103 prior to applying the mold compound 106 in order to prevent the mold compound 106 from entering the recess 104. The lid 120 may be made of any suitable material (e.g., epoxy, silicone, etc.) that can be adhered to the backside 103 for blocking the mold compound 106 from entering the recess 104.

Figure 2C:
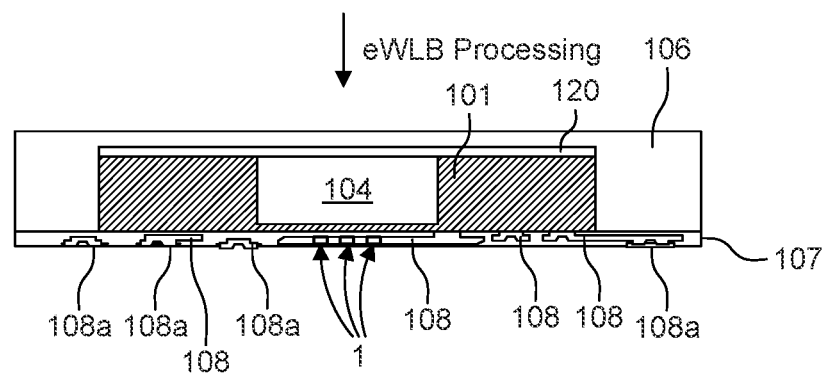

In FIG. 2C, the frontside of the MMIC 101 and mold compound 106 structure are adhered to the dielectric layer 107 that includes the electrically conductive paths 108 with conductive pads 108a configured to be bonded to a respective electrical interface 109. It is noted that in this case the lid 120 is present.

Figure 2D:
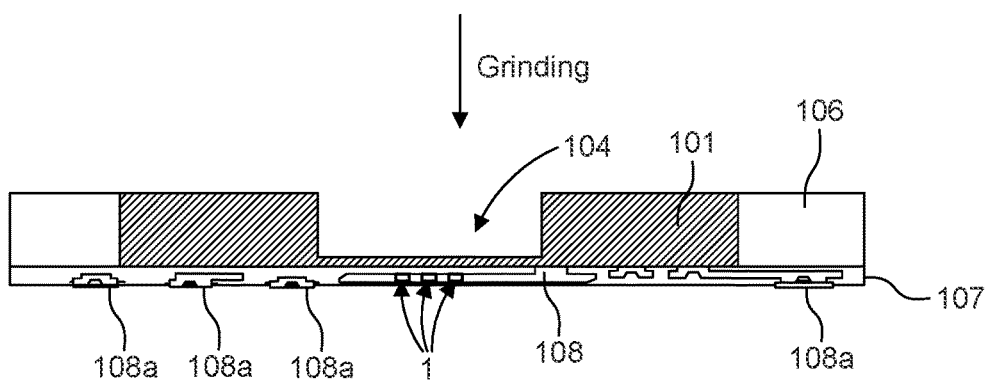

In FIG. 2D, the backside of the MMIC 101 and mold compound 106 structure is grinded to remove a portion of the mold compound 106, the lid 120, and possibly a portion of the MMIC 101. By doing so, the recess 104 is again an open recess that is open from the backside.

Figure 2E:
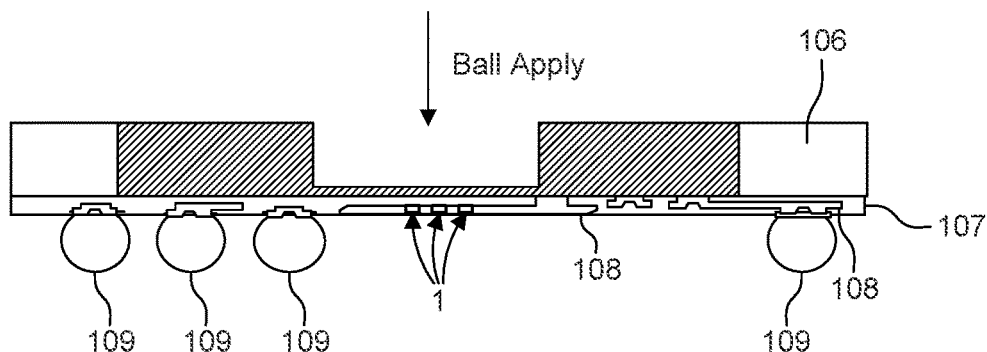

In FIG. 2E, the electrical interfaces 109 are bonded (e.g., soldered) to the conductive pads 108a of the RDL.

Figure 2F:
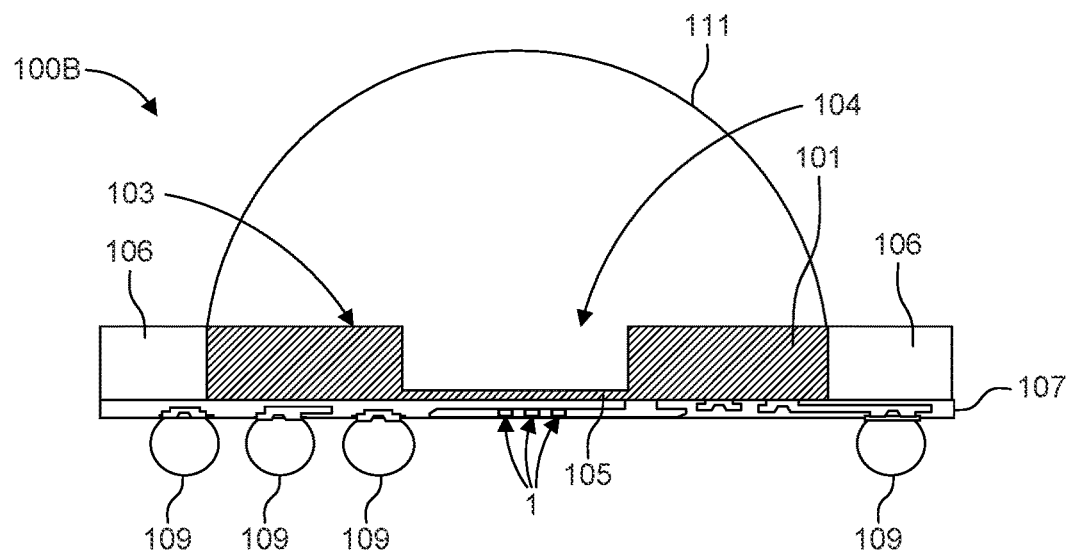

In FIG. 2F, the lens 111 arranged within the recess 104 making contact with both the remaining portion 105 and the backside 103 of the MMIC 101. The lens may be deposited as molding on the backside 103 and within the recess via lens molding that hardens after application or may be pre-formed and then adhered to the remaining portion 105 and the backside 103. Different lenses (e.g., different materials) can be used on the same package to achieve different radiation characteristics the provide difference detection ranges. Thus, the same manufacturing process can be used with different radiation characteristics and detection ranges being achievable simply by exchanging the lens material. This can provide considerable cost savings in manufacturing.

Figure 3:
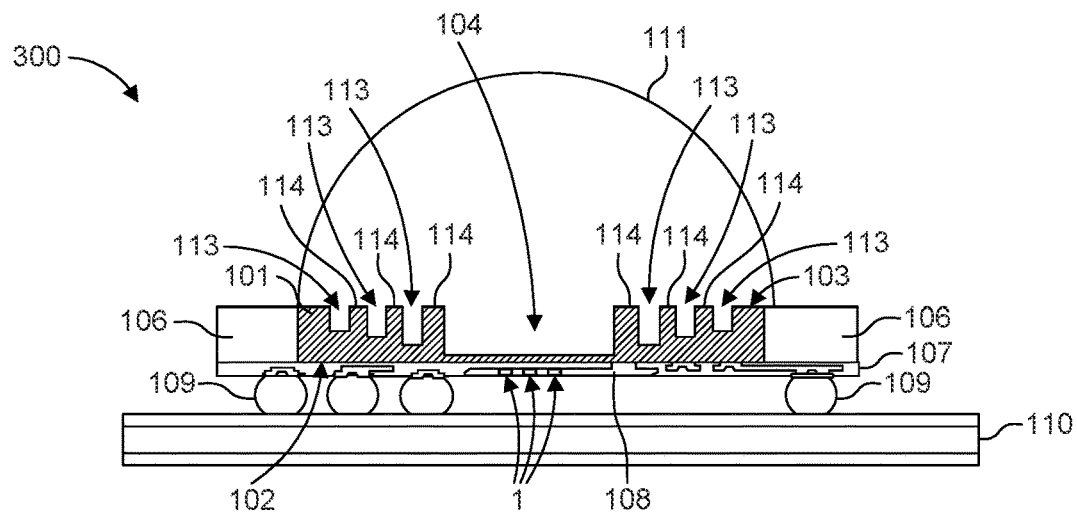
FIG. 3 shows a cross-sectional diagram of another radar chip package according to one or more embodiments.

FIG. 3 shows a cross-sectional diagram of a radar chip package 300 according to one or more embodiments. The radar chip package 300 is similar to radar chip package 100B except that trenches 113 are etched into the backside 103 of the MIMIC 101, laterally separated from recess 104. The trenches 113 extend from the backside 103 partially towards the frontside 102 with portions of the MIMIC 101 therebetween. These portions of the MMIC 101 are used as mechanical anchor structures 114 that add mechanical adhesion and mechanical stability to the lens 111 to anchor the lens 111 in place. Thus, in addition to filling the recess 104, the lens 111 also fills the trenches 113 such that the lens 111 is coupled to the sidewalls of the mechanical anchor structures 114. The trenches 113 and mechanical anchor structures 114 also prevent lateral movement of the lens 111. While trenches 113 are illustrated as an example, any uneven backside surface may aid in adhering the lens 111 to the backside. The lens 111 is a one-piece integral structure with a shape that conforms to shape of the backside 103 that includes the recess 104, the trenches 113, and the mechanical anchor structures 114.

Figure 4:
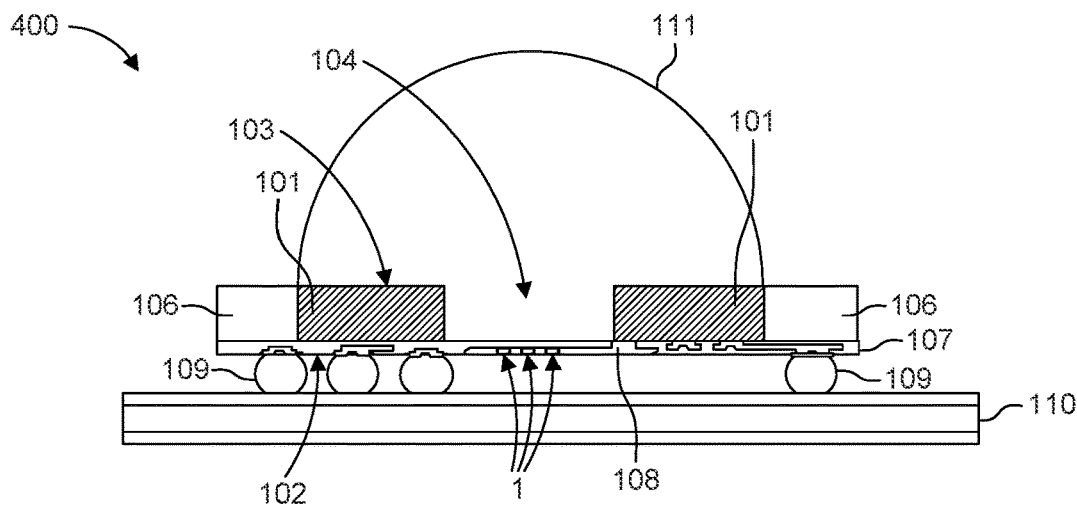
FIG. 4 shows a cross-sectional diagram of another radar chip package according to one or more embodiments.

FIG. 4 shows a cross-sectional diagram of a radar chip package 400 according to one or more embodiments. The radar chip package 400 is similar to radar chip package 100B except that the recess 104 is formed completely through the MMIC 101. Thus, there is no remaining portion 105 of the MMIC 101 in this example. Instead, the lens 111 makes contact with the dielectric layer 107.

While not illustrated, the radar chip package 400 may further include trenches 113 and mechanical anchor structures 114 as shown in FIG. 3. The lens 111 may be deposited such that it fills the trenches 113.

Figure 5:
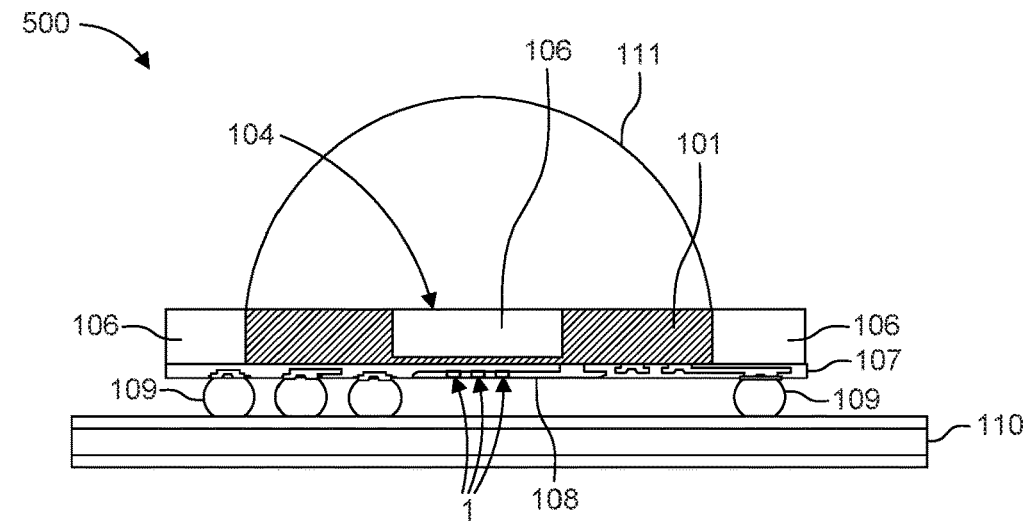
FIG. 5 shows a cross-sectional diagram of another radar chip package according to one or more embodiments.

FIG. 5 shows a cross-sectional diagram of a radar chip package 500 according to one or more embodiments. The radar chip package 500 is similar to radar chip package 100B except that the recess 104 is filled with mold compound 106. Thus, the lens 111 does not enter the recess 104. The backside of the mold compound 106 is co-planar with the backside of the MIMIC 101.

While not illustrated, the radar chip package 500 may further include trenches 113 and mechanical anchor structures 114 as shown in FIG. 3. The lens 111 may be deposited such that it fills the trenches 113.

Figure 6:
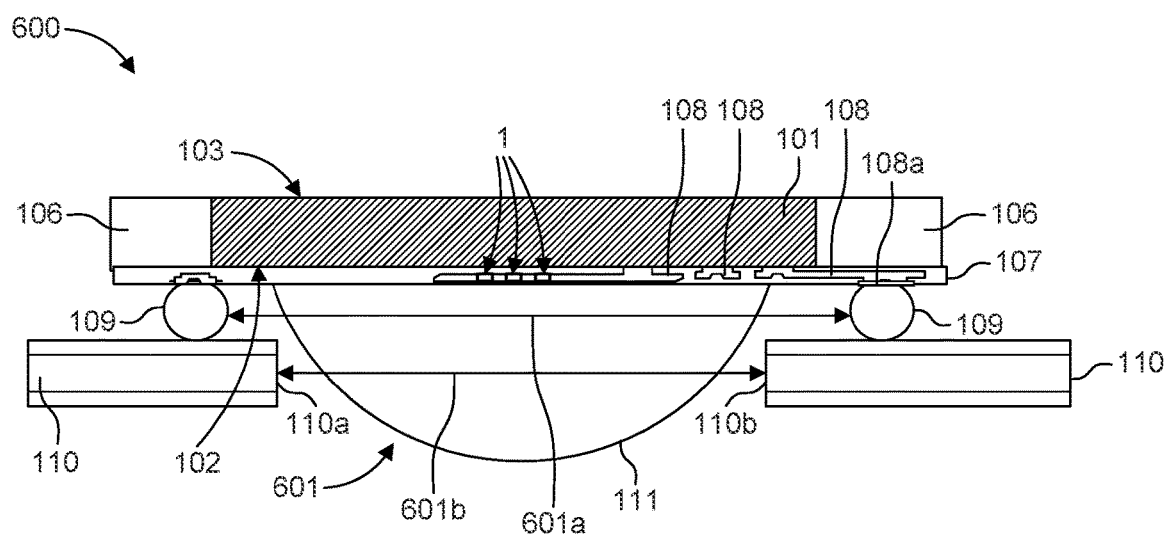
FIG. 6 shows a cross-sectional diagram of a radar chip package assembly according to one or more embodiments.

FIG. 6 shows a cross-sectional diagram of a radar chip package assembly 600 according to one or more embodiments. At least one antenna 1 can be integrated as illustrated in FIG. 1A or as illustrated in FIG. 1B. The arrangement of the lens 111 is inverted compared to the previous examples in that it is arranged on the frontside of the device. As a result, the backside 103 of the MIMIC 101 does not include a recess. In particular, the lens 111 is formed on the frontside of the dielectric layer 107 in an opening 601 formed in the circuit substrate 110. For example, the opening 601 may be formed between two separate circuit substrates or formed in a single circuit substrate. The electrical interfaces 109 (e.g., solder balls) are arranged at the lateral sides of the opening 601 and it can be said that they are arranged around a perimeter of the opening 601 that is formed therebetween. The lens 111 extends from the dielectric layer 107 and protrudes into and possibly entirely through the opening 601.

The opening 601 may be said to be a contiguous opening formed by two openings, a first opening 601a formed by the electrical interfaces 109 (i.e., in an area therebetween) and a second opening 601b formed through the circuit substrate(s) 110. Thus, opening 601, formed by these two openings, is a contiguous opening that extends from the dielectric layer 107 through the circuit substrate(s) 110. The lens 111 is arranged in the contiguous opening 601 such that it extends from the dielectric layer 107 through the first opening 601a and at least partially through the second opening 601b. The lens 111 protrudes between the inner lateral sidewalls 110a and 110b of the circuit substrate(s) 110 but may also extend fully through the second opening.

This arrangement improves radiation downward by removing a portion of the circuit substrate 110 and providing the lens 111 on the frontside of the package within the opening 601.

Figure 7:
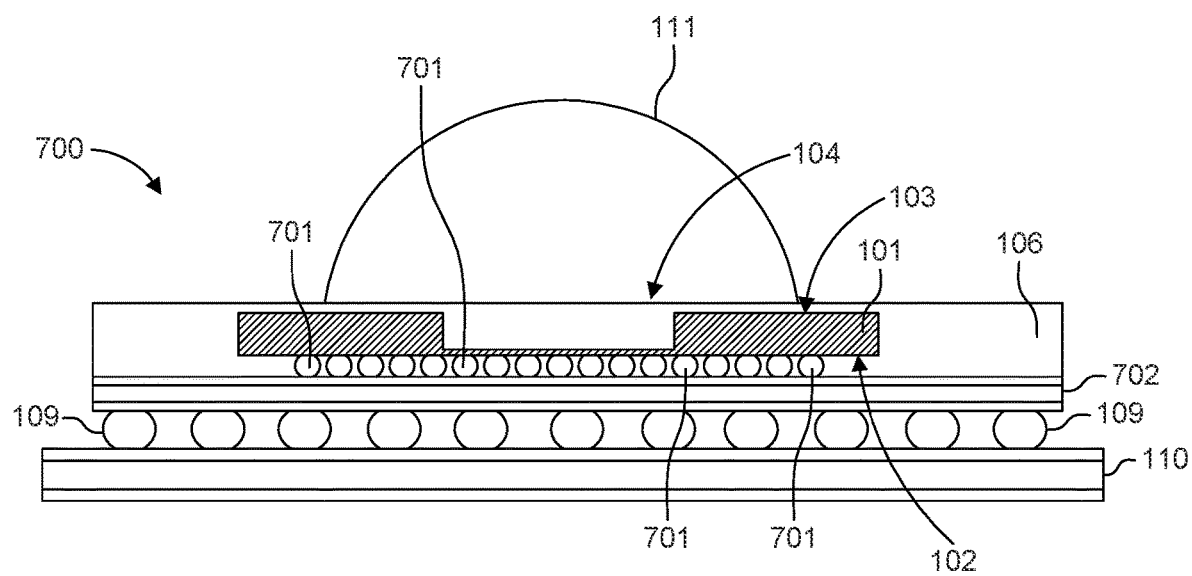
FIG. 7 shows a cross-sectional diagram of another radar chip package according to one or more embodiments.

FIG. 7 shows a cross-sectional diagram of a radar chip package 700 according to one or more embodiments. Radar chip package 700 is a flip chip ball grid array (FCBGA) package. The lens 111 is again arranged at the backside, centered over the recess 104. Here, mold compound 106 surrounds or encapsulates the MMIC 101 and the lens 111 is adhered to the backside of the mold compound 106. It can be seen that the mold compound 106 is used as an underfill under the frontside 102 of the MMIC 101. The mold compound 106 also fills the recess 104. The lens 111 is attached to the mold compound 106 after the formation thereof.

The radar chip package 700 includes electrical interfaces 701 (e.g., solder balls) electrically and mechanically coupled to the frontside 102 (i.e., to metalized pads) of the MMIC 101. The electrical interfaces 701 are further electrically and mechanically coupled to a circuit substrate 702 (e.g., a dielectric substrate with conductive interconnects routed therethrough), which may further be electrically and mechanically coupled to electrical interfaces 109 (e.g., solder balls) that are further electrically and mechanically coupled to circuit substrate 110.

The radar antenna 1 are integrated in the MMIC 101 (e.g., at the first metallization layer that is in direct electrical contact with the electrical interfaces 701), similar to the radar antenna 1 of radar chip package 100A.

Figure 8:
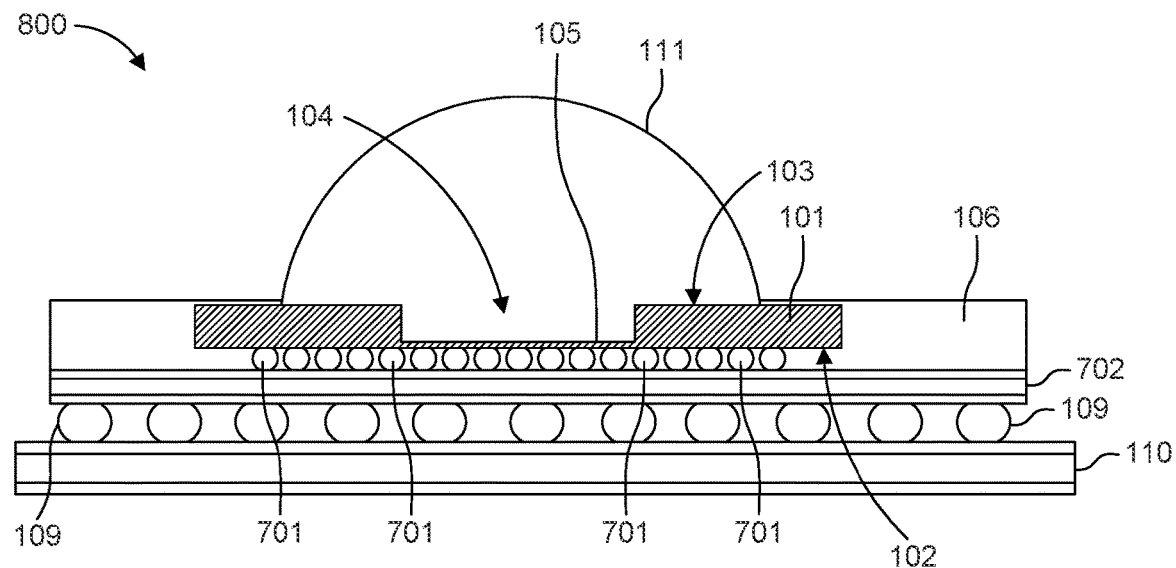
FIG. 8 shows a cross-sectional diagram of another radar chip package according to one or more embodiments.

FIG. 8 shows a cross-sectional diagram of a radar chip package 800 according to one or more embodiments. Radar chip package 800 is a FCBGA package that is similar to radar chip package 700, except that the recess 104 is not filled with mold compound 106. Instead, the lens 111 is formed in the recess 104 and is arranged on the remaining portion 105 and the backside 103 of the MMIC 101. As a result, the lens 111 is attached to the MMIC 101 prior to depositing the mold compound 106. Not only does this prevent the mold compound 106 from entering the recess, this process order allows the mold compound 106 onto the backside 103 of MMIC 101 and to be formed around and attached to the perimeter of the lens 111 via overmolding. This can provide improved lens adhesion and mechanical stability.

Figure 9:
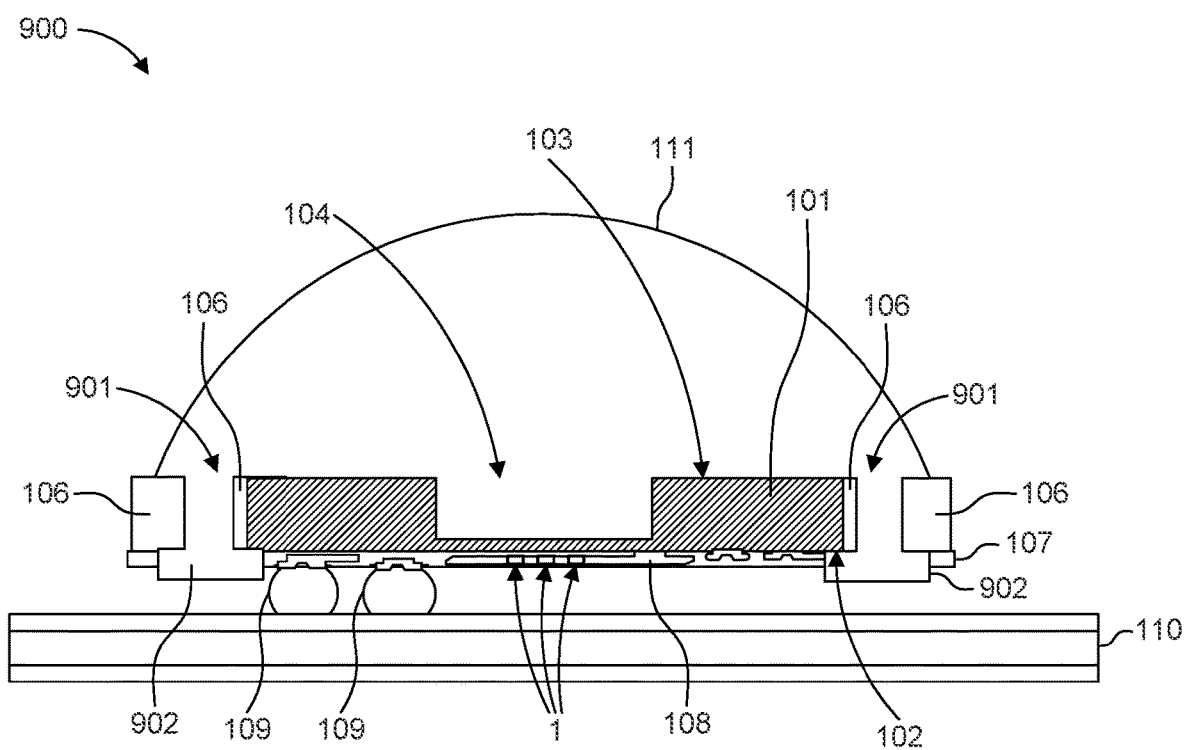
FIG. 9 shows a cross-sectional diagram of another radar chip package according to one or more embodiments.

FIG. 9 shows a cross-sectional diagram of a radar chip package 900 according to one or more embodiments. The radar chip package 900 is similar to radar chip package 100B except that through-holes 901 are formed through the mold compound 106 and the dielectric layer 107 at opposite lateral sides of the package 900. The lens 111 includes lens anchor structures 902 that extend from the backside through the through-holes 901. The lens anchor structures 902 wrap partially around the frontside and are attached thereto. As a result of the lens anchor structures 902, the lens is securely attached to the MMIC 101 and the mold compound 106. The lens 111 can be attached by hot stamping where the lens is heated and pressed into and through the through-holes 901. The lens 111, including its lens anchor structures 902, is a one-piece integral structure.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the method steps may be executed by such an apparatus.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Furthermore, the description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid in the understanding of the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof. Thus, it is understood that modifications and variations of the arrangements and the details described herein will be apparent to others skilled in the art.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

What is claimed is:

1. A radar chip package, comprising:
   a radar monolithic microwave integrated circuit (MMIC) comprising a semiconductor substrate having a backside, a frontside arranged opposite to the backside, and lateral sides that extend between the backside and the frontside, wherein the semiconductor substrate is a one-piece integral member comprising radar circuitry, and wherein the radar MMIC comprises a recess that extends into the semiconductor substrate from the backside of the semiconductor substrate at least partially towards the frontside of the semiconductor substrate;
   a plurality of electrical interfaces coupled to the frontside of the semiconductor substrate of the radar MMIC;
   at least one antenna arranged at the frontside of the semiconductor substrate of the radar MMIC; and
   a lens formed over the recess and the at least one antenna, wherein the lens is coupled to the backside of the semiconductor substrate of the radar MMIC.

2. The radar chip package of claim 1, wherein the at least one antenna is integrated in a metallization layer of the radar MMIC that is arranged at the frontside of the radar MMIC, and wherein the at least one antenna is integrated in an area of the metallization layer that vertically overlaps with the recess.

3. The radar chip package of claim 1, further comprising:
   a dielectric layer coupled to the frontside of the semiconductor substrate of the radar MMIC between the radar MMIC and the plurality of electrical interfaces, wherein the dielectric layer comprises a conductive redistribution layer that is electrically coupled to and between the radar MMIC and the plurality of electrical interfaces.

4. The radar chip package of claim 3, wherein the at least one antenna is integrated in the dielectric layer in an area that vertically overlaps with the recess.

5. The radar chip package of claim 4, wherein:
   the recess extends fully through the semiconductor substrate from the backside to the frontside of the semiconductor substrate, and
   the lens fills the recess and laterally extends over the backside of the semiconductor substrate of the radar MMIC, wherein the lens is further coupled to the dielectric layer at the recess.

6. The radar chip package of claim 5, wherein the recess is substantially centered on a geometrical center of the radar MMIC and the lens is substantially centered over the recess.

7. The radar chip package of claim 1, wherein the recess is substantially centered on a geometrical center of the radar MMIC and the lens is substantially centered over the recess.

8. The radar chip package of claim 7, wherein the lens fills the recess and laterally extends over the backside of the semiconductor substrate of the radar MMIC.

9. The radar chip package of claim 7, further comprising:
   a mold compound that fills the recess such that a backside of the mold compound is co-planar with the backside of the semiconductor substrate of the radar MIMIC, wherein the lens is coupled to the backside of the semiconductor substrate of the radar MMIC and to the backside of the mold compound.

10. The radar chip package of claim 7, wherein:
    the recess extends from the backside of the semiconductor substrate partially towards the frontside of the semiconductor substrate such that the semiconductor substrate comprises a remaining portion of semiconductor material between the recess and the frontside of the semiconductor substrate, and
    the lens fills the recess and laterally extends over the backside of the semiconductor substrate of the radar MMIC, wherein the lens is further coupled to the remaining portion of the semiconductor material.

11. The radar chip package of claim 1, further comprising:
    a mold compound disposed at an outer perimeter of the lens, wherein the mold compound is formed over a portion of the outer perimeter of the lens such that the mold compound overlaps with the outer perimeter of the lens.

12. The radar chip package of claim 1, wherein:
    the semiconductor substrate includes a mechanical anchor structure formed laterally between the recess and a trench that extends into the semiconductor substrate from the backside of the semiconductor substrate towards the frontside of the semiconductor substrate, and
    the lens fills the trench such that the lens is coupled to a sidewall of the mechanical anchor structure that extends along the trench.

13. The radar chip package of claim 1, further comprising:
    a plurality of trenches that are each laterally displaced from the recess, wherein each of the plurality of trenches extend partially into the semiconductor substrate from the backside of the semiconductor substrate towards the frontside of the semiconductor substrate to form a plurality of mechanical anchor structures, and wherein the lens fills the plurality of trenches such that the lens is coupled to sidewalls of the plurality of mechanical anchor structures.

14. The radar chip package of claim 1, further comprising:
a mold compound arranged at and coupled to the lateral sides of the semiconductor substrate, wherein the mold compound includes a through-hole that extends completely through the mold compound, wherein the lens includes an anchor structure that extends through the through-hole of the mold compound and vertically overlaps with a backside and a frontside of the mold compound.

15. The radar chip package of claim 1, wherein:
the backside of the semiconductor substrate is uneven, and
a shape of the lens conforms to a shape of the backside of the semiconductor substrate.

16. The radar chip package of claim 1, wherein the lens is configured to magnify transmit radar waves transmitted by the at least one antenna or magnify receive radar waves received from an external environment for reception at the at least one antenna.

17. A radar chip package assembly, comprising:
a radar monolithic microwave integrated circuit (MMIC) comprising a semiconductor substrate having a backside, a frontside arranged opposite to the backside, and lateral sides that extend between the backside and the frontside, wherein the semiconductor substrate is a one-piece integral member comprising radar circuitry;
at least one antenna arranged at the frontside of the semiconductor substrate;
a plurality of electrical interfaces arranged at the frontside of the semiconductor substrate, wherein the plurality of electrical interfaces are arranged around a first opening that defines an area between the electrical interfaces of the plurality of electrical interfaces;
a dielectric layer coupled to the frontside of the semiconductor substrate between the semiconductor substrate and the plurality of electrical interfaces, wherein the dielectric layer comprises a conductive redistribution layer that is electrically coupled to and between the semiconductor substrate and the plurality of electrical interfaces; and
a lens coupled to the dielectric layer, wherein the dielectric layer is arranged between the lens and the frontside of the semiconductor substrate, and wherein the lens is arranged in the first opening formed between the plurality of electrical interfaces.

18. The radar chip package assembly of claim 17, wherein the plurality of electrical interfaces are solder balls.

19. The radar chip package assembly of claim 17, wherein the at least one antenna is integrated in a metallization layer of the radar MMIC that is arranged at the frontside of the semiconductor substrates MIMC, wherein the at least one antenna is integrated in an area of the metallization layer that vertically overlaps with the lens.

20. The radar chip package assembly of claim 17, wherein the at least one antenna is integrated in the dielectric layer in an area that vertically overlaps with the lens.

21. The radar chip package assembly of claim 17, further comprising:
at least one circuit substrate mechanically and electrically coupled to the plurality of electrical interfaces such that the plurality of electrical interfaces are interposed between the at least one circuit substrate and the dielectric layer, wherein the at least one circuit substrate comprises a second opening formed therethrough, and wherein the first opening and the second opening form a contiguous opening that extends from the dielectric layer through the at least one circuit substrate, and
wherein the lens is arranged in the contiguous opening such that the lens extends from the dielectric layer through the first opening and at least partially through the second opening.

22. The radar chip package assembly of claim 17, wherein the lens is configured to magnify transmit radar waves transmitted by the at least one antenna or magnify receive radar waves received from an external environment for reception at the at least one antenna.

23. The radar chip package of claim 1, wherein the radar MMIC is a radar chip.

24. The radar chip package of claim 1, wherein the lens extends into the recess to at least partially fill the recess such that the lens is partially embedded in the recess of the radar MMIC.

25. The radar chip package assembly of claim 17, wherein the dielectric layer is directly coupled to the frontside of the semiconductor substrate, and wherein the lens is directly coupled to the dielectric layer such that the dielectric layer is arranged directly between the frontside of the semiconductor substrate and the lens.

26. The radar chip package assembly of claim 17, wherein the lens extends is from the dielectric layer through the first opening formed between the plurality of electrical interfaces.

* * * * *

UNITED STATES PATENT AND TRADEMARK OFFICE
CERTIFICATE OF CORRECTION

PATENT NO. : 11,823,970 B2
APPLICATION NO. : 17/308472
DATED : November 21, 2023
INVENTOR(S) : Bernhard Rieder et al.

Page 1 of 1

It is certified that error appears in the above-identified patent and that said Letters Patent is hereby corrected as shown below:

On the Title Page

Item (57) ABSTRACT, Lines 5, 8 and 9, "MIMIC" should be changed to -- MMIC --;

In the Claims

In Claim 9, Column 10, Line 32, "substrate of the radar MIMIC," should be changed to -- substrate of the radar MMIC, --;

In Claim 19, Column 12, Line 6, "semiconductor substrates MIMC," should be changed to -- semiconductor substrate, --.

Signed and Sealed this
Fourteenth Day of May, 2024

Katherine Kelly Vidal
*Director of the United States Patent and Trademark Office*